United States Patent
Wang

(10) Patent No.: US 11,895,873 B2
(45) Date of Patent: Feb. 6, 2024

(54) DISPLAY PANEL, DISPLAY SCREEN, AND ELECTRONIC DEVICE

(71) Applicant: TCL CHINA STAR OPTOELECTRONICS TECHNOLOGY CO., LTD., Shenzhen (CN)

(72) Inventor: Guojie Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 685 days.

(21) Appl. No.: 17/055,489

(22) PCT Filed: Sep. 9, 2020

(86) PCT No.: PCT/CN2020/114138
§ 371 (c)(1),
(2) Date: Nov. 13, 2020

(87) PCT Pub. No.: WO2022/027774
PCT Pub. Date: Feb. 10, 2022

(65) Prior Publication Data
US 2023/0067185 A1  Mar. 2, 2023

(30) Foreign Application Priority Data
Aug. 5, 2020 (CN) .......................... 202010775583.0

(51) Int. Cl.
*H01L 27/32* (2006.01)
*H10K 59/122* (2023.01)
(Continued)

(52) U.S. Cl.
CPC .......... *H10K 59/122* (2023.02); *H10K 59/131* (2023.02); *H10K 59/40* (2023.02); *H10K 71/00* (2023.02); *H10K 71/135* (2023.02)

(58) Field of Classification Search
CPC .... H10K 59/122; H10K 59/131; H10K 59/40; H10K 71/00; H10K 71/135; H10K 59/88; H10K 59/12
See application file for complete search history.

(56) References Cited

U.S. PATENT DOCUMENTS 9,305,981 B2 * 4/2016 Furuie .................... H10K 59/88
2019/0123307 A1   4/2019 Kim
(Continued)

FOREIGN PATENT DOCUMENTS

CN  105280842 A  1/2016
CN  106125177 A  11/2016
(Continued)

OTHER PUBLICATIONS

International Search Report in International application No. PCT/CN2020/114138, dated Mar. 26, 2021.
(Continued)

*Primary Examiner* — Elmito Breval
(74) *Attorney, Agent, or Firm* — PV IP PC; Wei Te Chung; Zhigang Ma

(57) ABSTRACT

A display panel, a display screen, and an electronic device are disclosed. The display panel includes a plurality of auxiliary areas at least provided on adjoining two sides outside a display area. The auxiliary areas each include a positioning sub-area and a non-positioning sub-area. The positioning sub-area includes a geometric center, and the positioning sub-area has light transmittance opposite to that of a corresponding non-positioning area.

20 Claims, 3 Drawing Sheets

(51) Int. Cl.
*H10K 59/131* (2023.01)
*H10K 59/40* (2023.01)
*H10K 71/13* (2023.01)
*H10K 71/00* (2023.01)

(56) References Cited

U.S. PATENT DOCUMENTS

2019/0305221 A1* 10/2019 Hou .................. H10K 59/122
2020/0388230 A1* 12/2020 Lee .................. G09G 3/3275

FOREIGN PATENT DOCUMENTS

| | | |
|---|---|---|
| CN | 106772738 A | 5/2017 |
| CN | 108572477 A | 9/2018 |
| JP | 2008224474 A | 9/2008 |

OTHER PUBLICATIONS

Written Opinion of the International Search Authority in International application No. PCT/CN2020/114138, dated Mar. 26, 2021.

* cited by examiner

DISPLAY PANEL, DISPLAY SCREEN, AND ELECTRONIC DEVICE

This application is a Notional Phase of PCT Patent Application No. PCT/CN2020/114138 having international filing date of Sep. 9, 2020, which claims priority to Chinese Patent Application No. 202010775583.0 filed on Aug. 5, 2020, the entire contents of which are incorporated by reference in this application.

BACKGROUND OF INVENTION

1. Field of Invention

The present invention relates to a technical field of displays, and particularly to, a display panel, a display screen, and an electronic device.

2. Related Art

Display panels include a plurality of pixel units. Each of the pixel units includes a red (R) subpixel, a green (G) subpixel, and a blue (B) subpixel. R, G, B subpixels are arranged alternately and repeatedly to form an array structure.

Although inkjet printing technology is implemented without using fine metal masks, accuracy of relative positions of print head modules and pixels on substrates is required to be ensured during printing. Only when the relative positions are accurate can material of corresponding colors be printed to the corresponding pixels. If the relative positions are deviated, it will cause wrong printing and thus results in unqualified products.

However, since anodes of organic light-emitting diode display panels are made of metal material and are highly reflective, and pixel intervals between subpixels are very small, locating of pixel positions on substrates and determination of relative positions of print head modules and pixels on substrates are adversely tremendously affected, thereby being prone to printing defects caused by incorrect determination of the relative positions, and reducing product yield.

SUMMARY OF INVENTION

An object of the present invention is to provide a display panel, a display screen, and an electronic device to prevent printing defects, thereby improving product yield.

An embodiment of the present application provides a display area comprising a plurality of display subpixels arranged in an array, wherein the display subpixels arranged in the array comprise a plurality of display subpixel rows and a plurality of display subpixel columns; and a plurality of auxiliary areas at least provided on adjoining two sides outside the display area, and the auxiliary areas corresponding to one of the display subpixel rows and the display subpixel columns; wherein the auxiliary areas each comprises a positioning sub-area and a non-positioning sub-area located outside the positioning sub-area, wherein the positioning sub-area comprises a geometric center corresponding to a location of a geometric center of a corresponding one of the auxiliary areas, and the positioning sub-area has light transmittance opposite to that of the non-positioning area.

The present invention further provides a display screen, comprising the aforementioned display panel.

The present invention further provides an electronic device, comprising the aforementioned display screen.

Each of the display panel, the display screen, and the electronic device in accordance with the embodiments of the present application includes a display area comprising a plurality of display subpixels arranged in an array. The display subpixels arranged in the array comprise a plurality of display subpixel rows and a plurality of display subpixel columns. A plurality of auxiliary areas are at least provided on adjoining two sides outside the display area, and the auxiliary areas correspond to one of the display subpixel rows and the display subpixel columns. The auxiliary areas each comprise a positioning sub-area and a non-positioning sub-area located outside the positioning sub-area, wherein the positioning sub-area comprises a geometric center corresponding to a location of a geometric center of a corresponding one of the auxiliary areas, and the positioning sub-area has light transmittance opposite to that of the non-positioning area. Since the auxiliary areas are additionally provided on an outside of the display area, locations of the display subpixels can be determined by locating the positioning sub-areas, so that printing defects caused by incorrect determination of relative positions can be prevented, thereby improving product yield.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
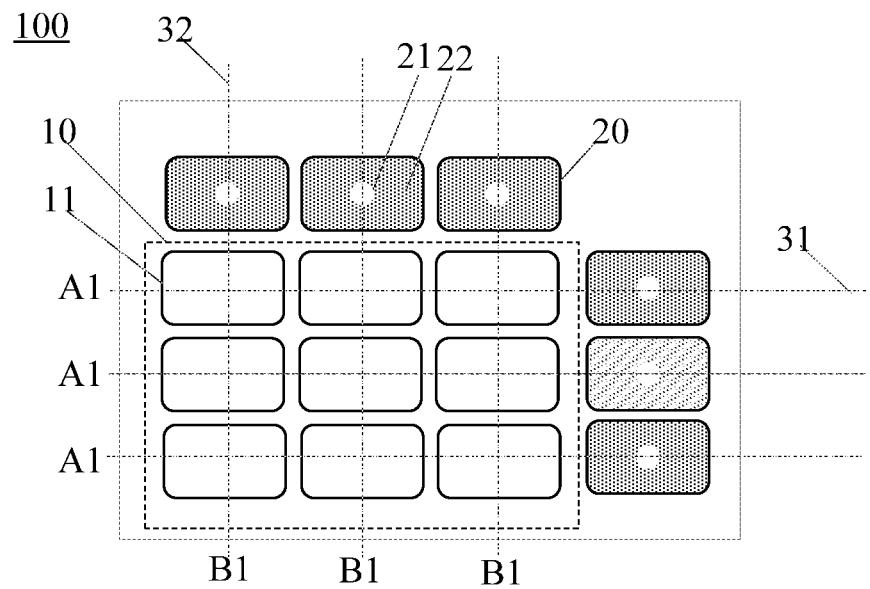
FIG. 1 is a top plan view of a display panel in accordance with an embodiment of the present application.

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the description of the present invention, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present invention is to simplify the description, but does not indicate or imply that the device or element referred to must have a particular orientation in a particular orientation construction and operation, and therefore not be construed as limiting the present invention.

In the present invention, unless otherwise explicitly specified or limited, the terms "mounted", "linked", "connected", and like terms are to be broadly understood. For example, it may be a fixed connection, a detachably connection, or an integrally connection, or may be a mechanical connection, electrically connection, or a directly connection. Alternatively, it can also be connected indirectly through intervening structures, or may be interaction between the two internal communicating elements or two elements. Those of ordinary skill in the art, to be understood that the specific meanings in the present invention in accordance with specific circumstances.

In the present application, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present invention. To simplify the disclosure of the present invention, the components and configuration of specific examples are described hereinafter. Of course, they are only illustrative, and are not intended to limit the present invention. Further, the present disclosure may repeat reference numerals in different embodiments and/or the reference letters. This repetition is for the purpose of simplicity and clarity, and does not indicate a relationship between the various embodiments and/or set in question. Further, the present invention provides various specific examples of materials and processes, but one of ordinary skill in the art may be appreciated that other processes and applications and/or other materials.

Please refer to FIGS. 1 to 4. FIG. 1 is a top plan view of a display panel in accordance with an embodiment of the present application.

As shown in FIG. 1, the display panel 100 includes a display area 10 and a plurality of auxiliary areas 20. The display area 10 includes a plurality of display subpixels 11 arranged in an array. The display subpixels 11 arranged in the array include a plurality of display subpixel rows A1 and a plurality of display subpixel columns B1.

The auxiliary areas 20 are at least provided on adjoining two sides outside the display area 10, and the auxiliary areas 20 correspond to one of the display subpixel rows A1 and the display subpixel columns B1.

The auxiliary areas 20 each includes a positioning sub-area 21 and a non-positioning sub-area 22 located outside the positioning sub-area 21, The positioning sub-area 21 includes a geometric center corresponding to a location of a geometric center of a corresponding one of the auxiliary areas 20. The positioning sub-area 21 has light transmittance opposite to that of a corresponding one of the non-positioning sub-areas 22. For example, when the positioning sub-area 21 is light transmissive, the corresponding non-positioning sub-area 22 is not light transmissive. A top plan view of the positioning sub-area 21 includes, but is not limited to, figures with geometric centers, such as circles, triangles, rectangles, and ellipses.

In one embodiment, each of the auxiliary areas 20 has a geometric center located in a direction extending from a corresponding one of a first center line 31 or a second center line 32 to improve accuracy of location determination. Specifically, the first center line 31 is defined by a connection line consisting of geometric centers of the display subpixels 11 on a same row, and the second center line 32 is defined by a connection line consisting of geometric centers of the display subpixels 11 on a same column.

In one embodiment, in order to further improve the accuracy of location determination, at least an auxiliary area 20 is provided on an outside of each of the display subpixel rows A1, and at least an auxiliary area 20 is provided on an outside of each of the display subpixel columns B1.

Figure 2:
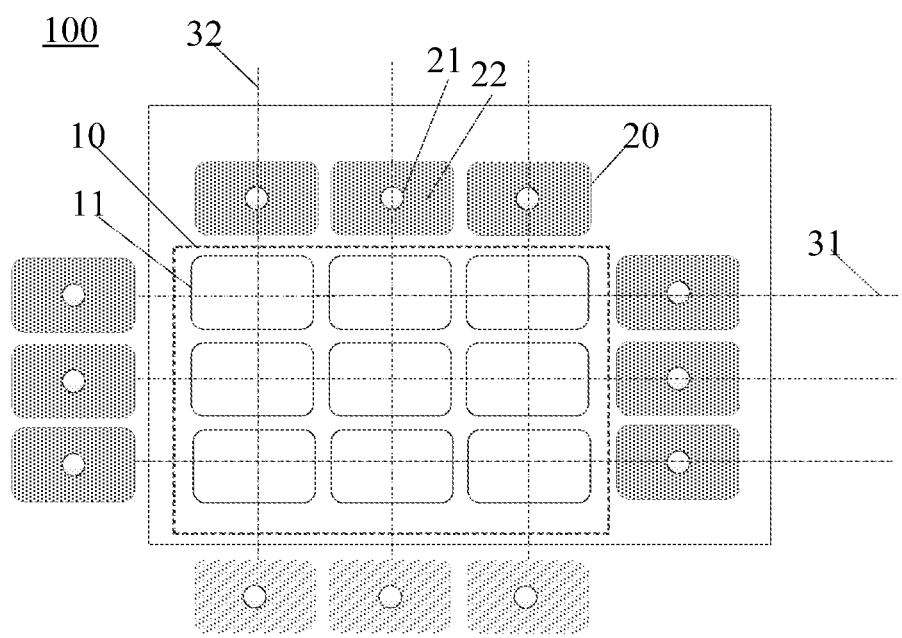
FIG. 2 is a top plan view of a display panel in accordance with another embodiment of the present application.

As shown in FIGS. 1 and 2, in order to further improve the accuracy of location determination, in a preferable embodiment, at least one of the auxiliary areas 20 is provided on each of two sides of each of the display subpixel rows A1, and at least one of the auxiliary areas 20 is provided on each of two sides of each of the display subpixel columns B1. Certainly, it can be understood that in other embodiments, the auxiliary area 20 can be disposed on outsides of some of the display subpixel rows A1, or on outsides of some of the display subpixel columns B1.

Figure 3:
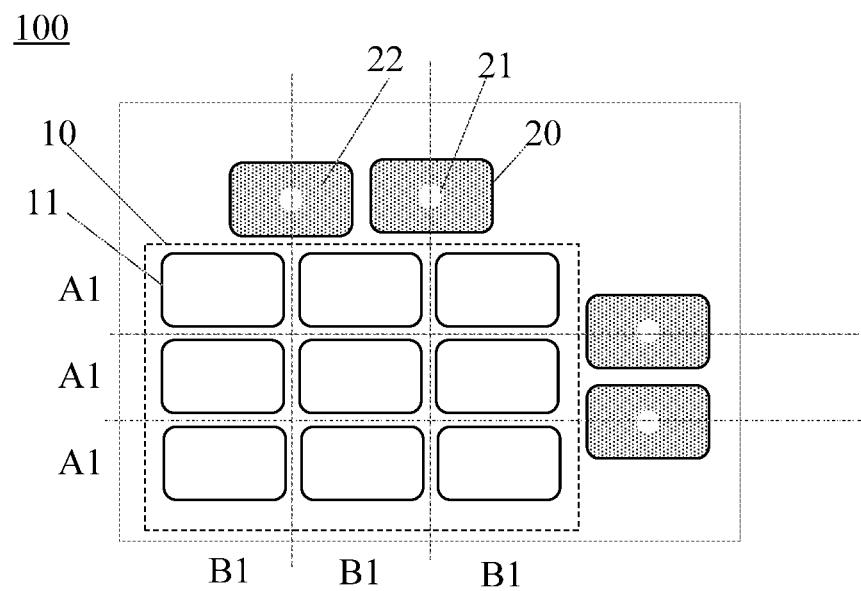
FIG. 3 is a top plan view of a display panel in accordance with another embodiment of the present application.

In another embodiment, each of the geometric centers of the auxiliary areas 20 is located corresponding to a gap provided between adjacent two of the display subpixel rows A1 or corresponding to a gap provided between adjacent two of the display subpixel columns B1. In order to further improve the accuracy of location determination, as shown in FIG. 3, the geometric center of the auxiliary area 20 may be located at a middle of the gap between adjacent two of the display subpixel rows A1 or between adjacent two of the display subpixel columns B1. Certainly, a corresponding relationship between the auxiliary area 20 and the display subpixel row A1 or the display subpixel column B1 is not limited to this.

In one embodiment, in order to improve the accuracy of location determination, the positioning sub-area 21 has an orthographic projection projected on a predetermined plan and having an area less than that of an orthographic projection of a corresponding one of the auxiliary areas 20 projected on the predetermined plan. The predetermined plan is a plan in which the display panel is disposed.

In one embodiment, in order to improve the accuracy of location determination, the area of the orthographic projection of the positioning sub-area 21 is less than or equal to one-third of a predetermined projection area. The predetermined projection area is the area of the orthographic projection of one of the auxiliary areas 20 corresponding to the positioning sub-area 21 projected on the predetermined plan. If the area of the positioning sub-area 21 is too large, the contrast between the area outside the positioning sub-area 21 and a surrounding area will be too small, which makes it difficult to obtain the geometric center of the display subpixel 11. If the area is too small, it will increase the difficulty with manufacturing process, and it is prone to abnormal pattern etching.

Figure 4:
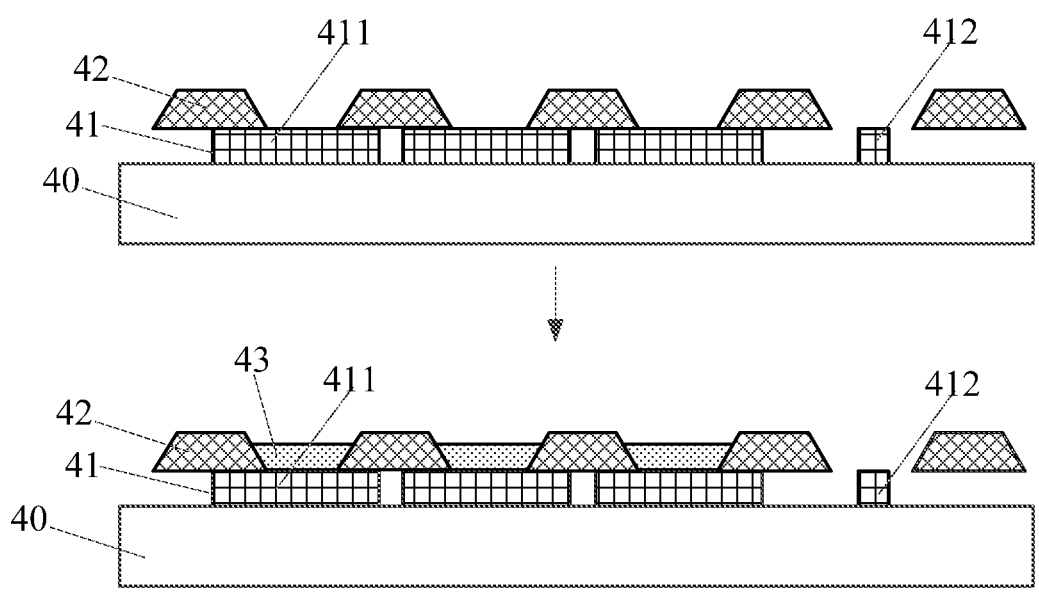
FIG. 4 is a schematic view showing a process of manufacturing a display panel in accordance with an embodiment of the present application.

In one embodiment, as shown in FIG. 4, each of the auxiliary areas 20 further includes an electrically conductive portion 412. The electrically conductive portion 412 corresponds to a location of the positioning sub-area 21, wherein a geometric center of the electrically conductive portion 412 is a geometric center of the positioning sub-area 21. In one embodiment, the electrically conductive portion 412 may be made of a metal material. In this manner, light can strike the display panel 100 from a direction above the display panel 100. Since the electrically conductive portion 412 is light reflective, and the auxiliary area other than the electrically conductive portion 412 does not reflect light, a location of the positioning sub-area is determined by obtaining an area which is light reflective. Alternatively, light can strike the display panel 100 from a direction below the display panel 100. In this embodiment, since the electrically conductive portion 412 is not light transmissive, while areas other than the electrically conductive portion are light transmissive, a location of the positioning sub-area is determined by obtaining an area which is not light transmissive. That is, one of the positioning sub-area 21 or the non-positioning sub-area 22 is a light transmissive area, and the other is an opaque area, and the light transmittance of the positioning sub-area 21 and the non-positioning sub-area 22 is opposite. In another embodiment, a material of the electrically conductive portion 412 can be a transparent conductive material. In this manner, light can strike the display panel from a direction below the display panel. Since the electrically conductive portion 412 is light transmissive and the auxiliary area other than the electrically conductive portion 412 is not light transmissive, a location of the positioning sub-area is determined by obtaining an area which is light transmissive.

In one embodiment, in order to simplify manufacturing processes and reduce product cost, the display subpixels include an anode 411. The electrically conductive portion 412 and the anode 411 are configured on a same layer and made of a same material.

The display panel is an organic light-emitting diode display panel.

As shown in FIG. 4, an embodiment of the present application further provides a method of manufacturing a display panel. The method includes: S101, providing a driving substrate 40. The driving substrate 40 may include a base substrate and a switch array layer. The switch array layer includes a plurality of switch elements.

The base substrate is made of a material including one or more of glass, silicon dioxide, polyethylene, polypropylene, polystyrene, polylactic acid, polyethylene terephthalate, polyimide, or polyurethane.

The switch array layer includes at least a thin-film transistor. In one embodiment, the switch array layer includes a light shielding layer, a buffer layer, a semiconductor layer, a gate insulating layer, a gate electrode, a first insulating layer, a second metal layer, a second insulating layer, and a planarization layer. The second metal layer includes a source electrode and a drain electrode. Certainly, it can be understood that a structure of the switch array layer is not limited to this. A material of the semiconductor layer includes at least one of indium gallium zinc oxide (IGZO), indium gallium zinc tin oxide (IGZTO), and indium tin zinc oxide (ITZO). A material of the gate insulating layer may include one or more of silicon oxide (SiO2), silicon nitride (SiNx), and aluminum oxide (Al2O3). The first insulating layer, the second insulating layer, and the planarization layer may be made of the same material as that of the gate insulating layer. A material of the gate electrode and the second metal layer may include at least one of copper, molybdenum, titanium, or aluminum.

S102: fabricating an electrically conductive layer 41 on the driving substrate 40, and patterning the electrically conductive layer 41 to form an anode 411 and an electrically conductive portion 412.

S103: fabricating a pixel definition layer 42 on the anode 411, patterning the pixel definition layer 42 to form a plurality of pixel openings (not shown), and fabricating a light-emitting layer 43 in the pixel openings in a display area. Furthermore, a cathode may be formed on the light-emitting layer 43.

Figure 5:
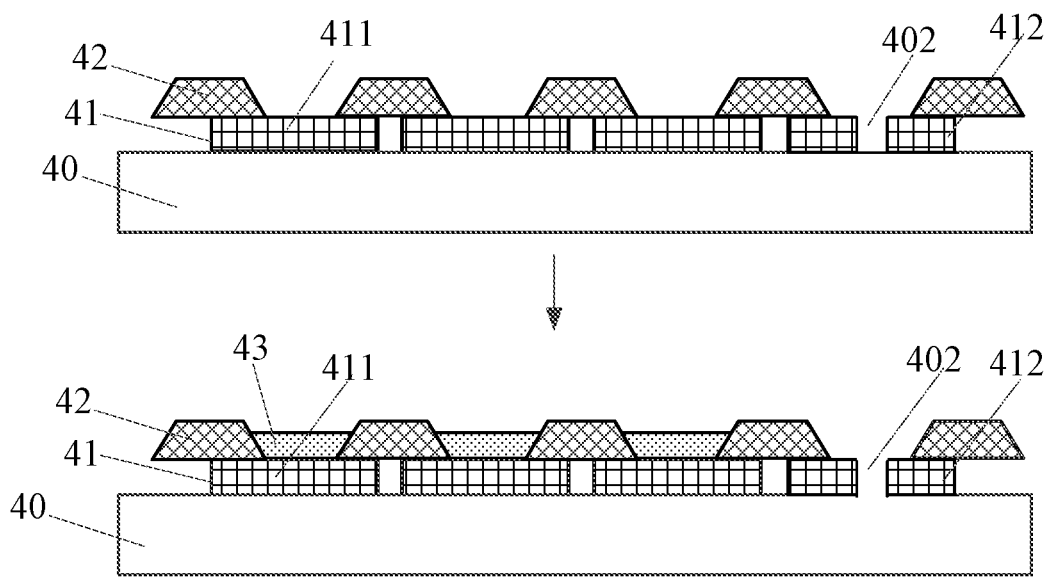
FIG. 5 is a schematic view showing a process of manufacturing a display panel in accordance with another embodiment of the present application.

Please refer to FIG. 5. FIG. 5 is a schematic view showing a process of manufacturing a display panel in accordance with another embodiment of the present application.

A difference between this embodiment and the previous embodiment is that an area where an opening 402 is located forms the positioning sub-area 21.

As shown in FIG. 5, an opening 402 is formed in an area where the electrically conductive portion 412 corresponds to the positioning sub-area 21. That is, the area in which the opening 402 is formed is defined as the positioning sub-area 21, wherein the opening 402 has a geometric center defined as a geometric center of the positioning sub-area 21. In one embodiment, the electrically conductive portion 412 is made of a metal material. In this manner, light can strike the display panel from a direction above the display panel. Since the electrically conductive portion 412 is light reflective and the opening 402 is not light reflective, a location of the positioning sub-area is determined by obtaining an area where there is no light. In one embodiment, the electrically conductive portion 412 is made of a metal material. In this manner, light can strike the display panel from a direction below the display panel. Since the opening is light transmissive, but the electrically conductive portion 412 is not, a location of the positioning sub-area is determined by obtaining an area which is light transmissive.

As shown in FIG. 5, an embodiment of the present invention further provides a method of manufacturing a display panel. The method includes: S201: providing a driving substrate 40. The driving substrate 40 may include a base substrate and a switch array layer. The switch array layer includes a plurality of switch elements.

S102: fabricating an electrically conductive layer 41 on the driving substrate 40, and patterning the electrically conductive layer 41 to form an anode 411 and an electrically conductive portion 412.

S203: fabricating a pixel definition layer 42 on the anode 411, patterning the pixel definition layer 42 to form a plurality of pixel openings (not shown), and fabricating a light-emitting layer 43 in the pixel openings in a display area. Furthermore, a cathode may be formed on the light-emitting layer 43.

Since the auxiliary areas are further provided on an outside of the display area, the auxiliary areas correspond to the display subpixel rows or the display subpixel columns, the geometric centers of the positioning sub-areas correspond to the geometric centers of corresponding auxiliary areas, and the positioning sub-areas have light transmittance opposite to that of the non-positioning areas, locations of the display subpixels can be determined by locating the positioning sub-areas, so that printing defects caused by incorrect determination of relative positions can be prevented, thereby improving product yield.

It can be understood that FIGS. 1 to 5 only give an example, which does not limit the present invention.

Figure 6:
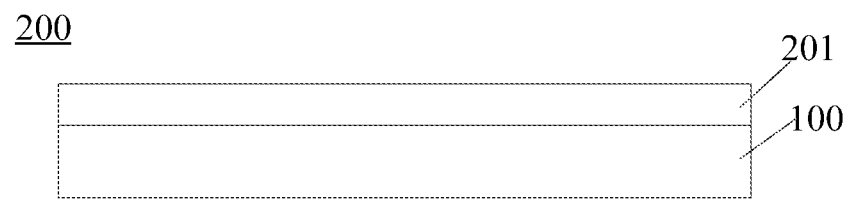
FIG. 6 is a schematic structural view of a display screen in accordance with an embodiment of the present application.

As shown in FIG. 6. The prevent application further provides a display screen 200 including the display panel 100 of the aforementioned embodiments. The display screen may further include a touch control layer 201. In one embodiment, the touch layer 201 can be arranged above the flexible display panel, but the arrangement of the touch layer 201 is not limited to this.

Figure 7:
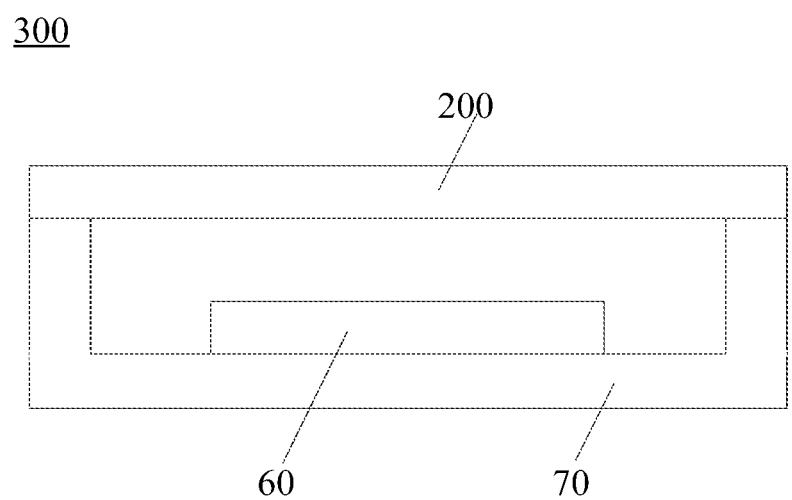
FIG. 7 is a schematic structural view of an electronic device in accordance with an embodiment of the present application.

Please refer to FIG. 7. FIG. 7 is a schematic structural view of an electronic device in accordance with an embodiment of the present application. An electronic device 300 may include a display panel 200, a control circuit 60, and a casing 70. It should be noted that the electronic device 300 shown in FIG. 7 is not limited to the above embodiment, and may also include other devices, such as a camera, an antenna structure, a pattern unlocking module, and the like.

Specifically, the display screen 200 is disposed on the casing 70.

In one embodiment, the display screen 200 can be fixed to the housing 70, and the display screen 200 and the housing 70 form a closed space to accommodate the control circuit 60 and other devices.

In one embodiment, the housing 70 may be made of a flexible material, such as a plastic housing or a silicone housing.

The control circuit 60 is installed in the housing 70, and the control circuit 60 may be a main board of the electronic device 300. Specifically, the control circuit 60 can be integrated with one, two or more of functional components, such as batteries, antenna structure, microphones, speakers, earphone interfaces, universal serial bus interfaces, cameras, distance sensors, ambient light sensors, receivers, and processors.

The display screen 200 is assembled in the housing 70, and at the same time, the display screen 200 is electrically connected to the control circuit 60 to form a display surface of the electronic device 300. The display screen 200 may include a display area and a non-display area. The display area can be used to display a screen of the electronic device 300 or for users to perform touch control. The non-display area can be used to set various functional components.

The electronic device includes, but is not limited to, mobile phones, tablet computers, computer monitors, game consoles, televisions, wearable devices, and other household appliances, or household appliances with display functions.

Each of the display panel, the display screen, and the electronic device in accordance with the embodiments of the present application includes a display area including a plurality of display subpixels arranged in an array. The display subpixels arranged in the array comprise a plurality of display subpixel rows and a plurality of display subpixel columns. A plurality of auxiliary areas are at least provided on adjoining two sides outside the display area, and the auxiliary areas correspond to one of the display subpixel rows and the display subpixel columns. The auxiliary areas each comprise a positioning sub-area and a non-positioning sub-area located outside the positioning sub-area, wherein the positioning sub-area comprises a geometric center corresponding to a location of a geometric center of a corresponding one of the auxiliary areas, and the positioning sub-area has light transmittance opposite to that of the non-positioning area. Since the auxiliary areas are further provided on an outside of the display area, locations of the display subpixels can be determined by locating the positioning sub-areas, so that printing defects caused by incorrect determination of relative positions can be prevented, thereby improving product yield.

The above describes in detail the display panel, display screen, and electronic device provided by the embodiments of the present disclosure. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. A display panel, comprising:
a display area comprising a plurality of display subpixels arranged in an array, wherein the display subpixels arranged in the array comprise a plurality of display subpixel rows and a plurality of display subpixel columns; and
a plurality of auxiliary areas at least provided on adjoining two sides outside the display area, and the auxiliary areas corresponding to one of the display subpixel rows and the display subpixel columns;
wherein the auxiliary areas each comprise a positioning sub-area and a non-positioning sub-area located outside the positioning sub-area, wherein the positioning sub-area comprises a geometric center corresponding to a location of a geometric center of a corresponding one of the auxiliary areas, and the positioning sub-area has light transmittance opposite to that of the non-positioning area.

2. The display panel of claim 1, wherein a first center line is defined by a connection line consisting of the geometric centers of the display subpixels on a same row, a second center line is defined by a connection line consisting of the geometric centers of the display subpixels on a same column, and each of the geometric centers of the auxiliary areas is located in a direction extending from a corresponding one of the first center line or the second center line.

3. The display panel of claim 1, wherein the positioning sub-area has an orthographic projection projected on a predetermined plan and having an area less than that of an orthographic projection of a corresponding one of the auxiliary areas projected on the predetermined plan.

4. The display panel of claim 3, wherein the area of the orthographic projection of the positioning sub-area is less than or equal to one-third of a predetermined projection area, wherein the predetermined projection area is the area of the orthographic projection of the corresponding one of the auxiliary areas projected on the predetermined plan.

5. The display panel of claim 1, wherein each of the geometric centers of the auxiliary areas is located corresponding to a gap provided between adjacent two of the display subpixel rows or corresponding to a gap provided between adjacent two of the display subpixel columns.

6. The display panel of claim 1, wherein each of the auxiliary areas further comprises an electrically conductive portion corresponding to a location of the positioning sub-area.

7. The display panel of claim 6, wherein the display subpixels comprise an anode, and the electrically conductive portion and the anode are configured on a same layer and made of a same material.

8. The display panel of claim 1, wherein each of the auxiliary areas further comprises an electrically conductive portion, wherein an opening is provided at a location corresponding to the electrically conductive portion and the positioning sub-area.

9. The display panel of claim 1, wherein at least one of the auxiliary areas is provided on an outside of each of the display subpixel rows and on an outside of each of the display subpixel columns.

10. The display panel of claim 9, wherein each of two sides of each of the display subpixel rows is provided with at least one of the auxiliary areas, and each of two sides of each of the display subpixel columns is provided with at least one of the auxiliary areas.

11. A display screen, comprising a display panel, wherein the display panel comprises:
a display area comprising a plurality of display subpixels arranged in an array, wherein the display subpixels arranged in the array comprise a plurality of display subpixel rows and a plurality of display subpixel columns; and
a plurality of auxiliary areas at least provided on adjoining two sides outside the display area, and the auxiliary areas corresponding to one of the display subpixel rows and the display subpixel columns;
wherein the auxiliary areas each comprise a positioning sub-area and a non-positioning sub-area located outside the positioning sub-area, wherein the positioning sub-area comprises a geometric center corresponding to a location of a geometric center of a corresponding one of the auxiliary areas, and the positioning sub-area has light transmittance opposite to that of the non-positioning area.

12. The display screen of claim 11, wherein a first center line is defined by a connection line consisting of the geometric centers of the display subpixels on a same row, a second center line is defined by a connection line consisting of the geometric centers of the display subpixels on a same column, and each of the geometric centers of the auxiliary areas is located in a direction extending from a corresponding one of the first center line or the second center line.

13. The display screen of claim 11, wherein the positioning sub-area has an orthographic projection projected on a predetermined plan and having an area less than that of an orthographic projection of a corresponding one of the auxiliary areas projected on the predetermined plan.

14. The display screen of claim 11, wherein each of the geometric centers of the auxiliary areas is located corresponding to a gap provided between adjacent two of the display subpixel rows or corresponding to a gap provided between adjacent two of the display subpixel columns.

15. The display screen of claim 11, wherein each of the auxiliary areas further comprises an electrically conductive portion corresponding to a location of the positioning sub-area.

16. The display screen of claim 15, wherein the display subpixels comprise an anode, and the electrically conductive portion and the anode are configured on a same layer and made of a same material.

17. The display screen of claim 11, wherein each of the auxiliary areas further comprises an electrically conductive portion, wherein an opening is provided at a location corresponding to the electrically conductive portion and the positioning sub-area.

18. The display screen of claim 11, wherein at least one of the auxiliary areas is provided on an outside of each of the display subpixel rows and on an outside of each of the display subpixel columns.

19. The display screen of claim 18, wherein each of two sides of each of the display subpixel rows is provided with at least one of the auxiliary areas, and each of two sides of each of the display subpixel columns is provided with at least one of the auxiliary areas.

20. An electronic device, comprising the display screen of claim 11.

* * * * *